United States Patent
Kim et al.

(10) Patent No.: US 10,522,583 B2
(45) Date of Patent: Dec. 31, 2019

(54) PHOTOELECTRIC CONVERSION ELEMENT AND OPTICAL SENSOR INCLUDING THE SAME

(71) Applicant: Samsung Electronics Co., Ltd., Suwon-si, Gyeonggi-do (KR)

(72) Inventors: Haeryong Kim, Seongnam-si (KR); Jaeho Lee, Seoul (KR); Sanghyun Jo, Seoul (KR); Hyeonjin Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/897,439

(22) Filed: Feb. 15, 2018

(65) Prior Publication Data
US 2019/0027529 A1 Jan. 24, 2019

(30) Foreign Application Priority Data
Jul. 19, 2017 (KR) .......................... 10-2017-0091607

(51) Int. Cl.
*H01L 33/00* (2010.01)
*H01L 27/146* (2006.01)
(Continued)

(52) U.S. Cl.
CPC .. *H01L 27/14652* (2013.01); *H01L 31/02161* (2013.01); *H01L 31/032* (2013.01);
(Continued)

(58) Field of Classification Search
CPC ..... G01J 5/20; G01J 5/0853; H01L 31/02161; H01L 31/032; H01L 31/035236;
(Continued)

(56) References Cited

U.S. PATENT DOCUMENTS

| 4,806,993 | A | | 2/1989 | Voisin et al. |
| 5,105,248 | A | * | 4/1992 | Burke ................... B82Y 20/00 |
| | | | | 257/183.1 |

(Continued)

FOREIGN PATENT DOCUMENTS

| EP | 1424736 B1 | 6/2007 |
| JP | 4281094 B2 | 6/2009 |

(Continued)

OTHER PUBLICATIONS

Zhang et al., "Evolution of Electronic Structure as a Function of Layer Thickness in Group-VIB Transition Metal Dichalcogenides: Emergence of Localization Prototypes", 2015, Nano Lett. 2015, 15, 949-957, published Jan. 6, 2015.*

(Continued)

*Primary Examiner* — Nikolay K Yushin
(74) *Attorney, Agent, or Firm* — Harness, Dickey & Pierce, P.L.C.

(57) ABSTRACT

A photoelectric conversion element and an optical sensor including the same are disclosed. The photoelectric conversion element may include a plurality of lattice stacks repeatedly stacked on top of each other on a substrate and configured to have an effective band gap. The plurality of lattice stacks may each include a first active layer and a second active layer on the first active layer. The first active layer may include a first two-dimensional material having a first band gap. The second active layer may include a second two-dimensional material having a second band gap not overlapping the first band gap. An effective band gap may be adjusted based on the first two-dimensional materials and thicknesses of the first active layer and the second active layer and a number of times of plurality of lattice stacks.

15 Claims, 7 Drawing Sheets

(51) Int. Cl.
*H01L 31/0216* (2014.01)
*H01L 31/032* (2006.01)
*H01L 31/0352* (2006.01)
*H01L 31/109* (2006.01)
*H01L 27/00* (2006.01)
*G01J 5/20* (2006.01)

(52) U.S. Cl.
CPC .... *H01L 31/035236* (2013.01); *H01L 31/109* (2013.01); *G01J 5/20* (2013.01)

(58) Field of Classification Search
CPC . H01L 31/109; H01L 31/1035; H01L 31/184; H01L 27/14652; H01L 27/0255; H01L 27/1465; H01L 27/148
See application file for complete search history.

(56) References Cited

U.S. PATENT DOCUMENTS

| | | | |
|---|---|---|---|
| 6,853,014 B2* | 2/2005 | Taylor | H01L 29/155 257/113 |
| 7,119,358 B2 | 10/2006 | Werner et al. | |
| 7,705,306 B2 | 4/2010 | Komiyama et al. | |
| 8,461,570 B2* | 6/2013 | Fujii | B82Y 20/00 257/21 |
| 8,975,513 B2 | 3/2015 | Harkness, IV et al. | |
| 9,595,580 B2* | 3/2017 | Shin | H01L 29/73 |
| 9,899,537 B2* | 2/2018 | Lin | H01L 29/778 |
| 2011/0210313 A1* | 9/2011 | Fujii | B82Y 20/00 257/21 |
| 2015/0122315 A1* | 5/2015 | Shin | H01L 29/73 136/255 |
| 2015/0179844 A1 | 6/2015 | Ergun et al. | |
| 2016/0093491 A1* | 3/2016 | Choi | H01L 21/02485 438/151 |
| 2017/0345944 A1* | 11/2017 | Lin | H01L 29/778 |

FOREIGN PATENT DOCUMENTS

| | | | |
|---|---|---|---|
| JP | 5999877 B2 | 9/2016 | |
| JP | 5999887 | * 9/2016 | H01L 31/078 |

OTHER PUBLICATIONS

Kumar et al., "Electronic structure of transition metal dichalcogenides monolayers . . . ", 2012, Eur. Phys. J, vol. 86, 186., pp. 1-7, Dec. 201.*

Huang et al, "Large-Area Synthesis of Highly Crystalline WSe2 Monolayers and Device Applications", 2014, ACS Nano, vol. 8, No. 1, pp. 923-930, Dec. 2013.*

Shaw et al., "Chemical vapor deposition growth of monolayer MoSe2 nanosheets", 2014, Nano Research vol. 7, No. 4, pp. 511-517, Jan. 2014.*

Seo et al., "Thickness-dependent structure and properties of SnS2 thin film prepared by atomic layer deposition", 2017, Japanese Journal of Applied Physics, vol. 56, pp. 031201-1-031201-5, published on Jan. 2017.*

Kang et al., "Thickness sorting of two-dimensional transition metal dichalcogenides via copolymer-assisted density gradient ultracentrifugation", 2014, Nature Communications, 5: 5478, pp. 1-7, Published Nov. 13, 2014.*

Extended European Search Report for EP Appl. No. 18170535.1 dated Dec. 19, 2018.

Ranzeghi, M., "Tye II superlattice enables high operating temperature," SPIE Newsroom, Oct. 25, 2011.

Chen, F. et al., "Transport in vertically stacked hetero-structures from 2D materials," Journal of Physics: Conf. Series 864 (2017).

* cited by examiner

PHOTOELECTRIC CONVERSION ELEMENT AND OPTICAL SENSOR INCLUDING THE SAME

CROSS-REFERENCE TO RELATED APPLICATION

This application claims the benefit of Korean Patent Application No. 10-2017-0091607, filed on Jul. 19, 2017, in the Korean Intellectual Property Office, the disclosure of which is incorporated herein in its entirety by reference.

BACKGROUND

1. Field

The present disclosure relates to a photoelectric conversion element and an optical sensor including the same.

2. Description of Related Art

Image sensors that capture an image of an object and convert the image into an electric signal are used not only in typical consumer electronic devices such as phone cameras and portable camcorders, but also in cameras mounted in security devices and robots. Such an image sensor is in general a complementary metal oxide semiconductor (CMOS) image sensor including silicon and is manufactured by using a typical manufacturing process, and thus, has excellent processability and high reliability. However, recently, limitations of the CMOS image sensor technology have emerged in applications such as bio-health, face recognition, fingerprint recognition, and security services as it is not possible to detect infrared (IR) regions via CMOS image sensors that include silicon. For example, a Si-based image sensor has a quantum efficiency of less than 30% in a near infrared (NIR) region. This corresponds to a low illumination intensity of less than 50% with respect to a visible light region.

Thus, research is being conducted into light-receiving elements for receiving light of various wavelength regions including an IR region with a high sensitivity.

SUMMARY

Provided are a photoelectric conversion element and an optical sensor comprising thereof.

Additional aspects will be set forth in part in the description which follows and, in part, will be apparent from the description, or may be learned by practice of the presented embodiments.

According to some example embodiments of inventive concepts, a photoelectric conversion element may include a substrate and a plurality of lattice stacks repeatedly stacked on top of each other on the substrate and configured to have an effective band gap. The plurality of lattice stacks may each include a first active layer and a second active layer on the first active layer. The first active layer may include a first two-dimensional material having a first band gap. The second active layer may include a second two-dimensional material having a second band gap not overlapping the first band gap.

In some example embodiments, the plurality of lattice stacks may form a multi-quantum well (MQW) structure.

In some example embodiments, the effective band gap of the plurality of lattice stacks may be adjusted according to a thickness of the first active layer.

In some example embodiments, the effective band gap of the plurality of lattice stacks may be adjusted according to a thickness of the second active layer.

In some example embodiments, a thickness of the first active layer may be different than a thickness of the second active layer.

In some example embodiments, a thickness of the first active layer and a thickness of the second active layer may each be in a range from about 1.0 nm to about 3.5 nm.

In some example embodiments, the effective band gap may be adjusted according to a type of the first two-dimensional material and a type of the second two-dimensional material.

In some example embodiments, the first two-dimensional material and the second two-dimensional material may each independently include one of a Group IV transition metal dichalcogenide (TMD) material, a Group V TMD material, or a Group VI transition metal dichalcogenide (TMD) material.

In some example embodiments, the first two-dimensional material and the second two-dimensional material may each independently include one of $MoS_2$, $MoSe_2$, $MoTe_2$, $WS_2$, $WSe_2$, $WTe_2$, $ZrS_2$, $ZrSe_2$, $HfS_2$, $HfSe_2$, $SnS_2$, $SnSe_2$, $VSe_2$, $VTe_2$, $VS_2$, $VSe_2$, $VTe_2$, $NBS_2$, $NBSe_2$, $NBTe_2$, $TaS_2$, $TaSe_2$, $TaTe_2$, $TiS_2$, $TiSe_2$, $HiTe_2$, $HfTe_2$, $MoTe_2$, or $WTe_2$.

In some example embodiments, each of the first two-dimensional material and the second two-dimensional material may independently include one of peroveskite, metal halide, graphitic carbon, or graphene.

In some example embodiments, the effective band gap may be adjusted according to a number of repeating lattice stacks in the plurality of lattice stacks.

In some example embodiments, a number of the plurality of lattice stacks repeatedly stacked on top of each other may be in a range of 3 to 100.

In some example embodiments, at least one of the plurality of lattice stacks may further include a blocking layer between the first active layer and the second active layer.

In some example embodiments, the effective band gap of the plurality of lattice stacks may correspond to an infrared region.

In some example embodiments, the photoelectric conversion element may further include a buffer layer between the substrate and the plurality of lattice stacks.

In some example embodiments, the photoelectric conversion element may further include a passivation layer on the plurality of lattice stacks.

According to some example embodiments, a photoelectric conversion element may include a substrate and a structure including a plurality of first active layers and a plurality of second active layers alternately arranged with each other on the substrate. The plurality of first active layers may contact the plurality of second active layers. The plurality of first active layers may each include a first two-dimensional material having a first band gap. The plurality of second active layers may each include a second two-dimensional material having a second band gap not overlapping the first band gap. The structure may be configured to have an effective band gap. The effective band gap may be based on a difference between a first energy level and a second energy level. The first energy level may be between a conduction band of the first two-dimensional material and a conduction band of the second two-dimensional material. The second energy level may be between a valence band of the first two-dimensional material and a valence band of the second two-dimensional material.

In some example embodiments, a thickness of at least one of the plurality of first active layers and a thickness of at least one of the plurality of second active layers may be each in a range from about 1.0 nm to about 3.5 nm.

In some example embodiments, the photoelectric conversion element may further include a plurality of blocking layers arranged between the plurality of first active layers and the plurality of second active layers.

In some example embodiments, the structure may include a plurality of heterojunctions defined by the plurality of first active layers directly contacting corresponding ones of the plurality of second active layers.

According to some example embodiments of inventive concepts, an optical sensor includes at least one of the above-described photoelectric conversion elements.

BRIEF DESCRIPTION OF THE DRAWINGS

These and/or other aspects will become apparent and more readily appreciated from the following description of some example embodiments, taken in conjunction with the accompanying drawings in which.

DETAILED DESCRIPTION

Figure 1:
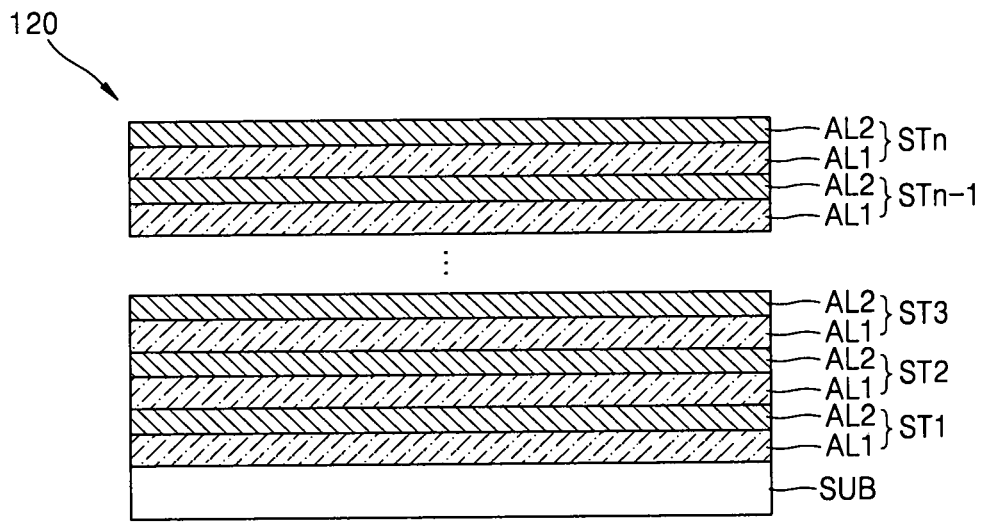
FIG. 1 is a schematic cross-sectional view of a photoelectric conversion element according to some example embodiments.

Reference will now be made in detail to embodiments, examples of which are illustrated in the accompanying drawings, wherein like reference numerals refer to like elements throughout. In this regard, the presented embodiments may have different forms and should not be construed as being limited to the descriptions set forth herein. Accordingly, the embodiments are merely described below, by referring to the figures, to explain aspects. Expressions such as "at least one of," when preceding a list of elements, modify the entire list of elements and do not modify the individual elements of the list.

In the drawings, the widths or thicknesses of layers or regions may be exaggerated for clarity and convenience in terms of description.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

While such terms as "first", "second", etc., may be used to describe various components, such components should not be limited to the above terms. The above terms are used only to distinguish one component from another.

An expression used in the singular form encompasses the expression in the plural form, unless it has a clearly different meaning in the context. In the present specification, it is to be understood that the terms such as "including" or "having", etc., are intended to indicate the existence of the components disclosed in the specification, and are not intended to preclude the possibility that one or more components may added.

FIG. 1 is a schematic cross-sectional view of a photoelectric conversion element 100 according to some example embodiments. Referring to FIG. 1, the photoelectric conversion element 100 may include a substrate SUB and a plurality of lattice stacks ST1 through STn including a first active layer AL1 and a second active layer AL2.

The substrate SUB may support the plurality of lattice stacks ST1 through STn. For example, the substrate SUB may be a silicon substrate or a sapphire substrate, but is not limited thereto. For example, the substrate SUB may include, without limitation, at least one of SiC, $MgAl_2O_4$, MgO, $LiAlO_2$, $LiGaO_2$, or GaN.

Each of the plurality of lattice stacks ST1 through STn may include a first active layer AL1 and a second active layer AL2. Hereinafter, description will focus on the first lattice stack ST1 for convenience of description, but the description applies commonly to all of the plurality of lattice stacks ST1 through STn.

The first lattice stack ST1 may include the first active layer AL1 and the second active layer AL2 that are in contact with each other. The first active layer AL1 and the second active layer AL2 may include different materials so as to form a hetero-junction structure. The first active layer AL1 may include a first two-dimensional material having a first band gap, and the second active layer AL2 may include a second two-dimensional material having a second band gap. The first band gap and the second band gap may not overlap each other. The first active layer AL1 and the second active layer AL2 may be bonded to each other and thus form a hetero-junction with an effective band gap.

The first active layer AL1 may include a first two-dimensional material. For example, the first two-dimensional material may be selected from Group IV, Group V, or Group VI transition metal dichalcogenide (TMD) materials. For example, the first two-dimensional material may include at least one of $MoS_2$, $MoSe_2$, $MoTe_2$, $WS_2$, $WSe_2$, $WTe_2$, $ZrS_2$, $ZrSe_2$, $HfS_2$, $HfSe_2$, $SnS_2$, $SnSe_2$, $VSe_2$, $VTe_2$, $VS_2$, $VSe_2$, $VTe_2$, $NBS_2$, $NBSe_2$, $NBTe_2$, $TaS_2$, $TaSe_2$, $TaTe_2$, $TiS_2$, $TiSe_2$, $HiTe_2$, $HfTe_2$, $MoTe_2$, or $WTe_2$. In addition, the first two-dimensional material may include one of perovskite, metal halide, graphitic carbon, or graphene.

The second active layer AL2 may include a second two-dimensional material. For example, the second two-dimensional material may be selected from Group IV, Group V, or Group VI TMD materials. For example, the second two-dimensional material may include at least one of $MoS_2$, MoSe$_2$, MoTe$_2$, WS$_2$, WSe$_2$, WTe$_2$, ZrS$_2$, ZrSe$_2$, HfS$_2$, HfSe$_2$, SnS$_2$, SnSe$_2$, VSe$_2$, VTe$_2$, VS$_2$, VSe$_2$, VTe$_2$, NBS$_2$, NBSe$_2$, NBTe$_2$, TaS$_2$, TaSe$_2$, TaTe$_2$, TiS$_2$, TiSe$_2$, HiTe$_2$, HfTe$_2$, MoTe$_2$, or WTe$_2$. In addition, the second two-dimensional material may include one of peroveskite, metal halide, graphitic carbon, or graphene.

A lattice stack formed by selecting Group IV, Group V, or Group VI TMD materials as the first and second two-dimensional materials and forming a hetero-junction using the materials may have an effective band gap that may be easy to adjust and may have high processability. In particular, a photoelectric conversion element that uses a hetero-junction structure as described above may be used to measure up to an infrared (IR) region, and an effective band gap thereof may also be adjusted even with a thickness of the lattice stack. Thus, it is easy to design and process the photoelectric conversion element. On the other hand, a photoelectric conversion element formed of only a single two-dimensional material has low processability and is likely to oxidize, thus having low stability in the atmosphere. In addition, a photoelectric conversion element that uses a quantum dot detector requires a reaction that is suitable for processes and has low processability, and ligands and size thereof are controlled three-dimensionally, and thus, it is difficult to adjust an absorption rate of the photoelectric conversion element. A graphene detector includes a semi-metal material, and thus it is easy to adjust a wavelength region of the graphene detector, but it is difficult to control a current and an energy band gap thereof.

An effective band gap of a photoelectric conversion element according to some example embodiments will be described with reference to FIGS. 2 through 5.

Figure 2:
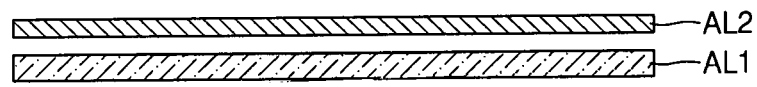
FIG. 2 illustrates a first active layer, a second active layer, and a band gap energy according to a comparative example.
Figure 2:
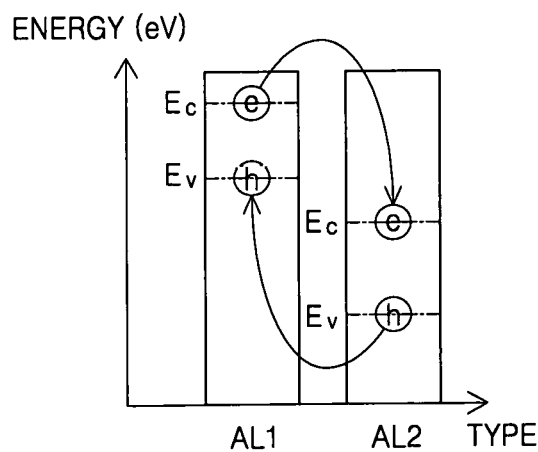

FIG. 2 illustrates a first active layer AL1, a second active layer, AL2 and a band gap energy thereof according to a comparative example. Referring to FIG. 2, a first band gap of the first active layer AL1 and a second band gap of the second active layer AL2 of a case when the first active layer AL1 and the second active layer AL2 are not in contact with each other are illustrated. The first band gap of the first active layer AL1 may be determined by a type of a first two-dimensional material and a thickness of the first active layer AL1. The second band gap of the second active layer AL2 may be determined by a type of a second two-dimensional material and a thickness of the second active layer AL2.

Figure 3:
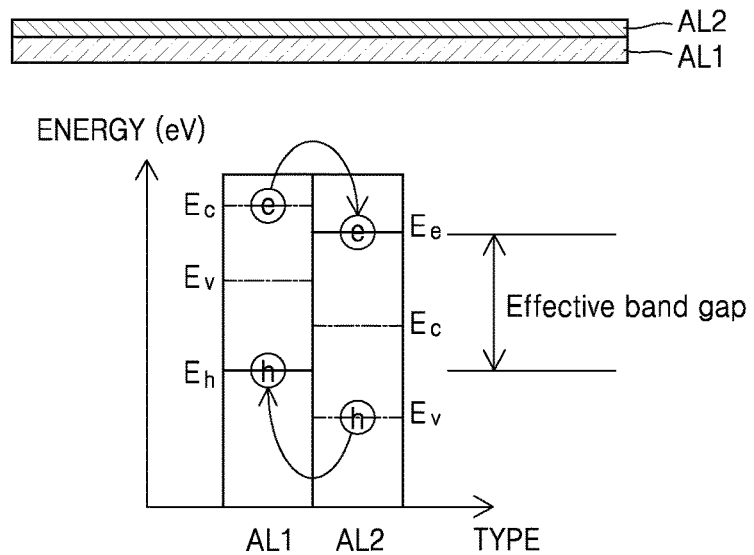
FIG. 3 illustrates a first active layer and a second active layer, which form a hetero-junction structure, and a band gap energy.

FIG. 3 illustrates a first active layer AL1 and a second active layer AL2 which form a hetero-junction and a band gap energy thereof. Referring to FIG. 3, an effective band gap is formed by forming a hetero-junction between the first active layer AL1 and the second active layer AL2. When a lattice stack includes a hetero-junction between the first active layer AL1 and the second active layer AL2, factors affecting an effective band gap of the lattice stack include a type of a first two-dimensional material, a type of a second two-dimensional material, a thickness of the first active layer AL1, and a thickness of the second active layer AL2. For example, an energy level Ee of a conduction band above the effective band gap of the lattice stack is proportional to 1/(meLB2). An energy level Eh below the effective band gap of the lattice stack is proportional to 1/(mhLA2). LB refers to a thickness of one of the first active layer AL1 and the second active layer AL2 that has a lower band gap. LA denotes a thickness of one of the first active layer AL1 and the second active layer AL2 that has a higher band gap. For example, LB may be a thickness of the second active layer AL2, and LA may be a thickness of the first active layer AL1, but are not limited thereto. LA and LB may be different from each other. The thicknesses LA and LB may be set to various values according to a desired effective band gap. For example, when an effective band gap is to be formed in an IR region, the thicknesses LA and LB may be set to be within a thickness range from about 1.0 nm to about 3.5 nm.

Figure 4:
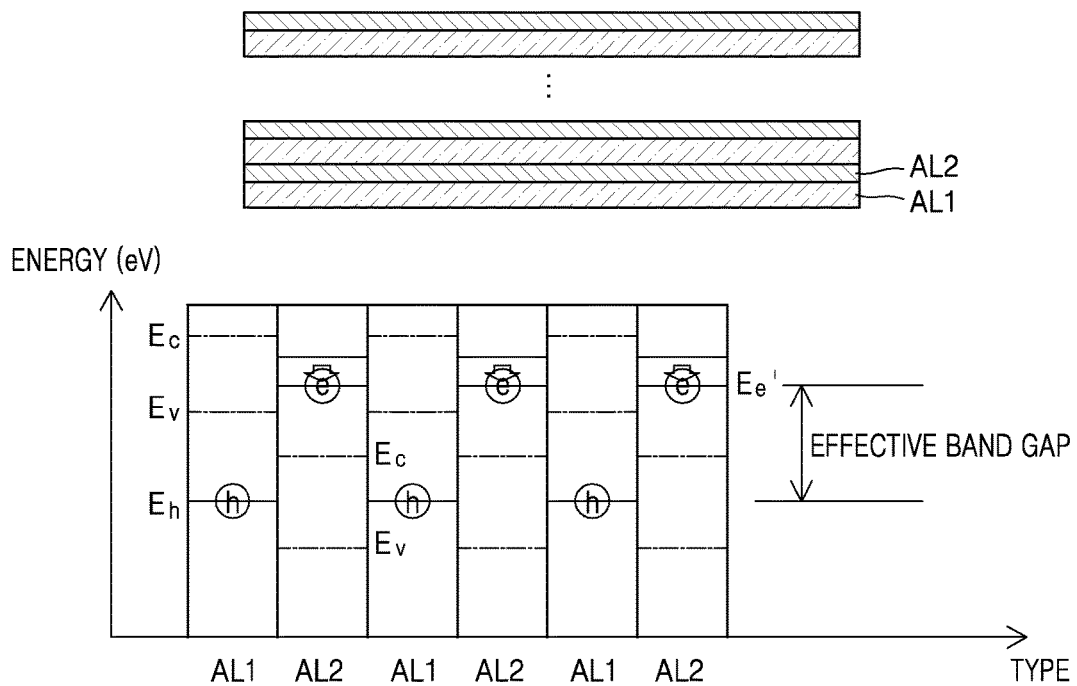
FIG. 4 illustrates a structure including a repeating lattice stack and a band gap energy of the structure.

FIG. 4 illustrates a structure including a repeating lattice stack and a band gap energy thereof. Referring to FIG. 4, a plurality of lattice stacks ST1 through STn may be repeatedly stacked. For example, the plurality of lattice stacks ST1 through STn may form a multi-quantum well (MQW). A width of an effective band gap may be adjusted based on the number of times n that the plurality of lattice stacks ST1 through STn are repeatedly stacked. For example, if an effective band gap is to be formed in an IR region, a number of times n of repeatedly stacking the lattice stacks may be 3 to 100 times. For example, a width of an effective band gap may be adjusted due to wave-function interference among adjacent lattice stacks from among the plurality of lattice stacks ST1 through STn. For example, as the lattice stack are stacked on one another, wave-function interference may occur among first active layers AL1 or among second active layers AL2 and change an energy level of the effective band gap. For example, due to wave-function interference among the first active layers AL1, an energy level Ee' of an upper conduction band of the effective band gap may be proportional to 1/(meLB2)−2t. Here, me denotes an electron effective mass; LB denotes a thickness of an active layer; and t denotes energy consumed to transmit through an adjacent active layer. Referring to FIG. 4, an energy level Ee of an upper conduction band of the plurality of lattice stacks ST1 through STn may be lower than the energy level Ee of the lattice stack ST1 and ST2 of FIG. 3 forming a hetero-junction.

Figure 5:
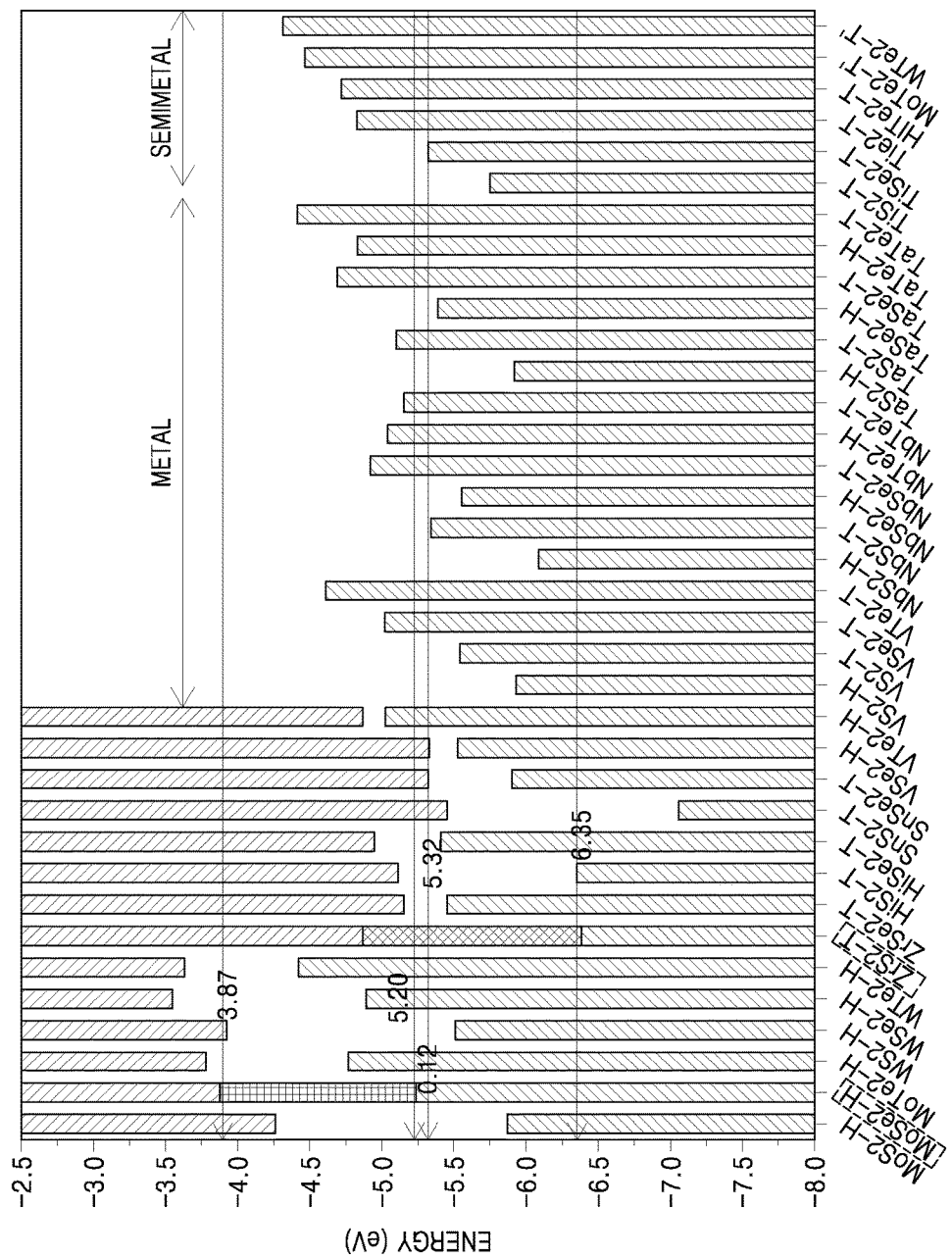
FIG. 5 is a graph showing two-dimensional transition metal dichalcogenide (TMD) materials and band gap energies thereof.

FIG. 5 is a graph showing two-dimensional TMD materials and band gap energies thereof. Referring to FIG. 5, two-dimensional TMD materials of Group IV, Group V, and Group VI and band gap energies thereof are illustrated. For example, a first two-dimensional material and a second two-dimensional material may be selected from the Group IV, V, and VI two-dimensional TMD materials. For example, an appropriate two-dimensional TMD material may be selected according to an effective band gap that corresponds to a wavelength of light to be received by a photoelectric conversion element. For example, ZrS$_2$ may have a band gap of 1.7 eV. Also ZrS$_2$ may have a lattice constant of 3.65 nm (see FIG. 7).

Figure 6:
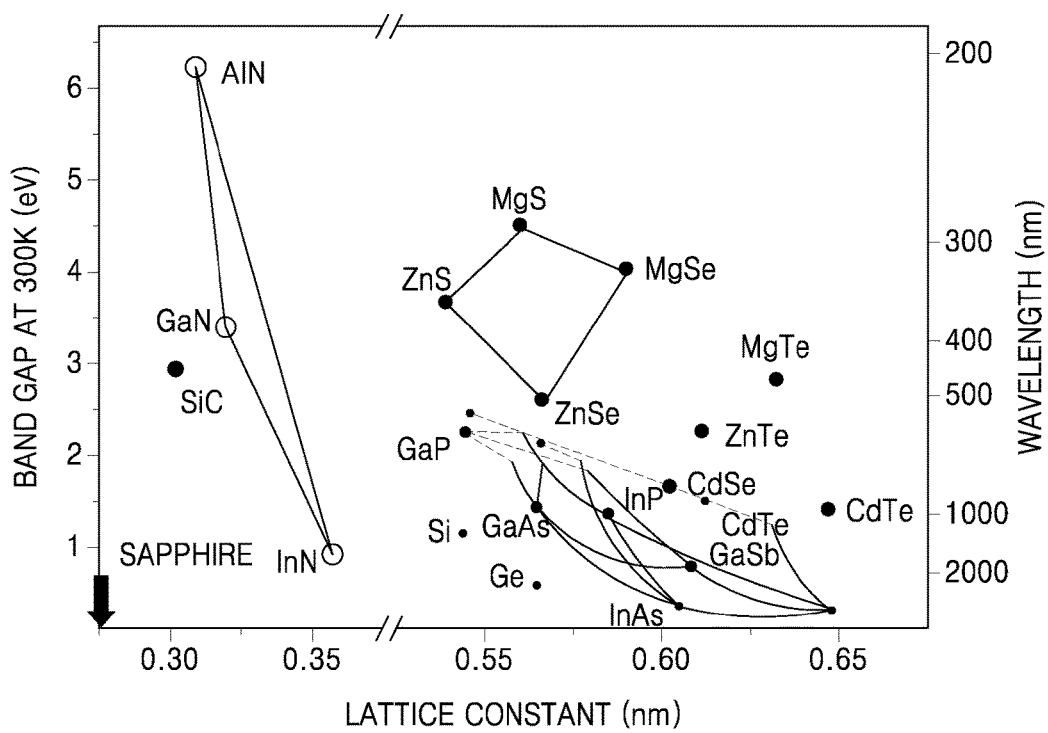
FIG. 6 is a graph showing a Type-2 Super Lattice (T2SL) material and a band gap energy thereof according to a comparative example.
Figure 7:
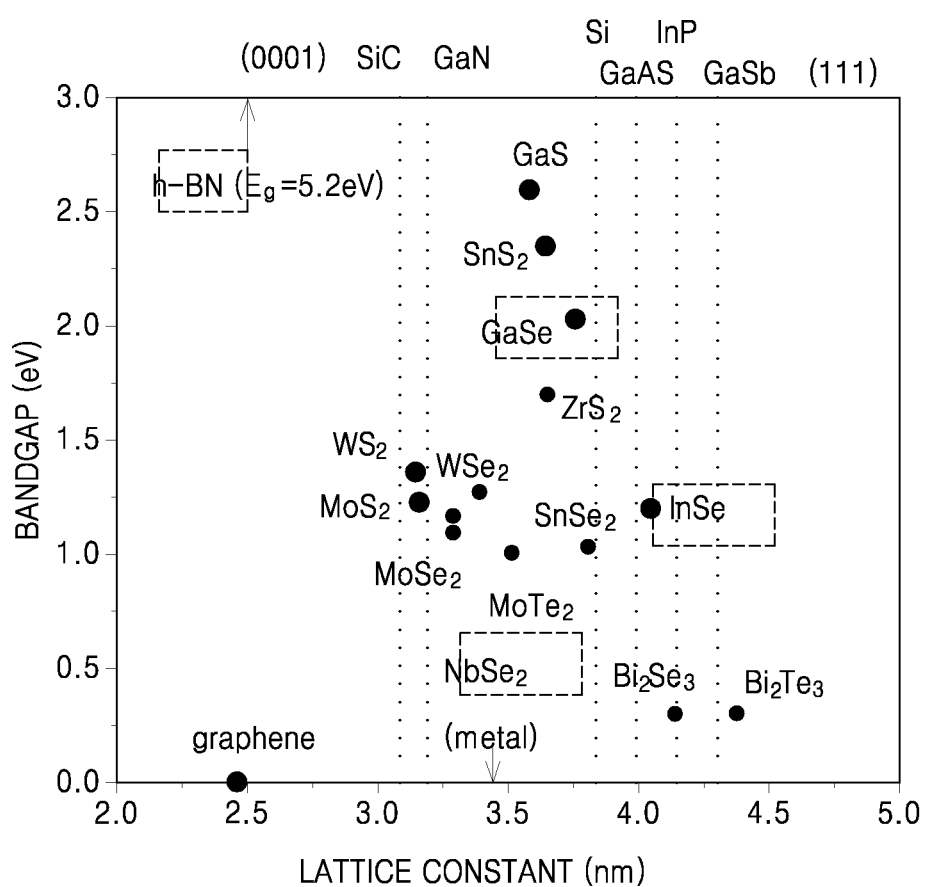
FIG. 7 is a graph showing a lattice constant of a two-dimensional TMD material and a band gap energy thereof.

FIG. 6 is a graph showing a Type 2 super lattice (T2SL) material and a band gap energy thereof according to a comparative example. FIG. 7 is a graph showing a lattice constant of a two-dimensional TMD material and a band gap energy thereof.

Referring to FIG. 6, when forming a lattice stack by using a T2SL material according to the comparative example, high processability may be provided. However, when a lattice stack is formed of a T2SL material, unlike when using a two-dimensional material, epitaxial growth may be limited. Thus, process-related limitations may be aroused in that a Group III or Group V material has to be selected as a substrate. In addition, as a T2SL material has low stability in the air, a packaging operation that uses a passivation layer may be required, which raises the costs. In addition, to grow a T2SL material, an expensive molecular beam epitaxy (MBE) may be required to form the device.

Referring to FIG. 7, when forming a lattice stack by using a two-dimensional TMD material, forming limitations may be less than in the case when a T2SL material is used. For example, a lattice stack including a two-dimensional TMD material may be epitaxially grown on a substrate of various types. For example, the substrate may include not only Group III to IV materials but also Si, $SiO_2$, Ge, and other two-dimensional materials. In addition, when using a two-dimensional TMD material, a lattice stack may be processed at a wafer level, and thus, processability is high. That is, when forming a lattice stack by using a two-dimensional TMD material, the process of forming the lattice stack is compatible with typical Si processes, thus allowing reduction of process costs. When growing a lattice stack, a metal organic chemical vapor deposition (MOCVD) device which is cheaper than MBE device may be used. In addition, as described above, bands to be sensed by using a lattice stack that uses a two-dimensional TMD material as described above may be adjusted. For example, bands to be sensed may be easily adjusted based on diverse parameters (e.g., type and thickness of a material of the first active layer, a type and thickness of a material of the second active layer, and the number of times of repeatedly stacking lattice stacks).

When forming a lattice structure through hetero-junction between the first active layer AL1 and the second active layer AL2, in order to limit and/or prevent lattice mismatch between the first active layer AL1 and the second active layer AL2, a first two-dimensional material and a second two-dimensional material having appropriate lattice constants may be selected. As illustrated in FIG. 7, lattice constants of two-dimensional TMD materials do not vary greatly. Thus, the first two-dimensional material and the second two-dimensional material to be used to form a lattice stack may be selected from the two-dimensional TMD materials according to FIG. 7 relatively without limitation. Accordingly, a high degree of freedom in respect of processes may be provided.

Figure 8:
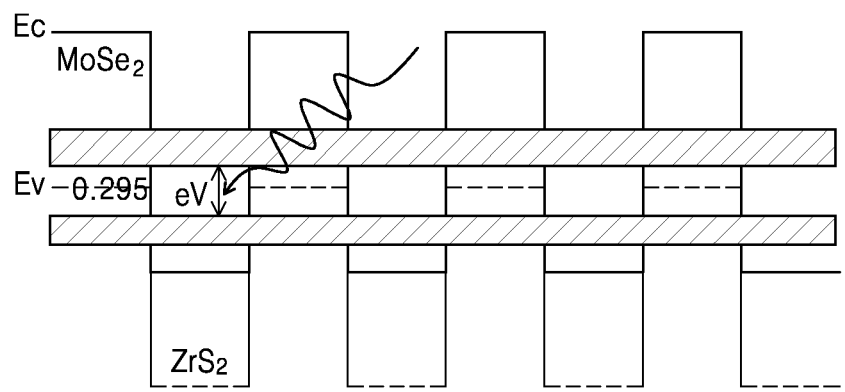
FIG. 8 is a schematic view of an effective energy band of a photoelectric conversion element according to some example embodiments.

FIG. 8 is a schematic view of an effective energy band of a photoelectric conversion element according to some example embodiments. The photoelectric conversion element according to some example embodiments is an example of designing a photoelectric conversion element receiving light in an IR region including a near infrared (NIR) region (0.75 um-1 um), a short wavelength infrared (SWIR) region (1 um-2.5 um), and a medium wavelength infrared (MWIR) region (3 um-5 um). In order to form an energy gap around 0.2 eV, $MoSe_2$ may be selected as the first two-dimensional material to form a first active layer, and $ZrS_2$ may be selected as the second two-dimensional material to form a second active layer. For example, a photoelectric conversion element in which the first active layer has a thickness of 2.1 nm and $MoSe_2$ is selected as a first two-dimensional material, and the second active layer has a thickness of 3.5 nm and $ZrS_2$ is selected as a second two-dimensional material, may have an effective band gap of 0.296 eV, and may receive light in an MWIR region and convert the light into an electric signal. The number of times of repeatedly stacking lattice stacks may be set to three to 100 times, appropriately according to necessity regarding design and adjusting of an effective band gap.

Figure 9:
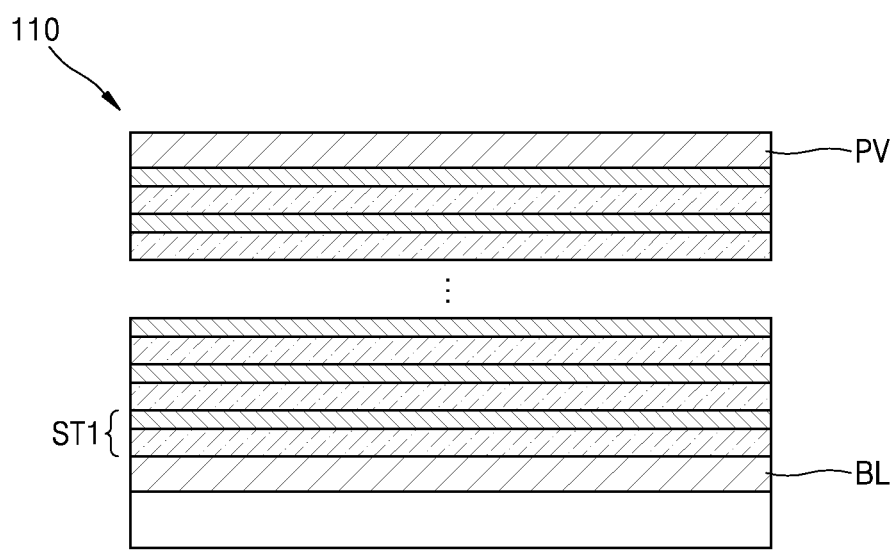
FIG. 9 is a schematic view of a photoelectric conversion element according to some example embodiments.

FIG. 9 is a schematic view of a photoelectric conversion element 110 according to some example embodiments. Referring to FIG. 9, the photoelectric conversion element 110 may further include a buffer layer BL on a substrate, and a passivation layer PV formed on an upper surface of a lattice stack.

The buffer layer BL may be an electron conductive layer having similar characteristics as those of the first lattice stack ST1. The buffer layer BL may be formed of a material having an energy level of a hole conductive layer of the first lattice stack ST1. For example, the buffer layer BL may be formed of a two-dimensional TMD material. The buffer layer BL may be formed by combining a plurality of layers or gradually converting a material composition according to necessity. The buffer layer BL is not limited to particular materials and may be formed of various materials.

The passivation layer PV may be formed on an upper surface of a lattice stack to protect the photoelectric conversion element 110 from external physical or chemical damage. For example, the passivation layer PV may encapsulate the lattice stack to limit and/or prevent oxidization thereof. The passivation layer PV may be formed of at least one of an oxide layer, polyimide, epoxy, or a silicon elastomer.

Figure 10:
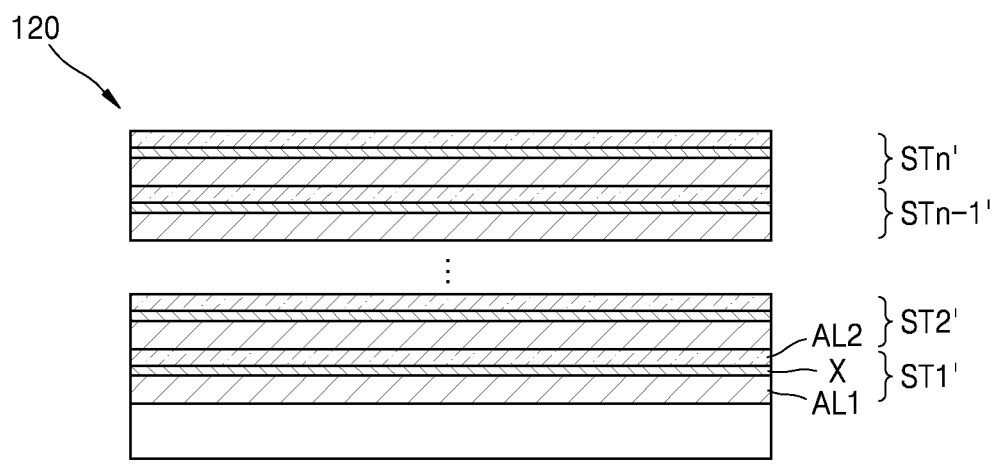
FIG. 10 is a schematic view of a photoelectric conversion element according to some example embodiments.

FIG. 10 is a schematic view of a photoelectric conversion element 120 according to some example embodiments. Referring to FIG. 10, the photoelectric conversion element 120 may include a plurality of lattice stacks ST1' through STn' that further include a blocking layer X between a first active layer AL1 and a second active layer AL2.

According to some example embodiments, each of the plurality of lattice stacks ST1' through STn' may further include the blocking layer X between the first active layer AL1 and the second active layer AL2. The blocking layer X may be formed between the first active layer AL1 and the second active layer AL2 to limit and/or prevent a dark current. For example, the blocking layer X may be formed of a two-dimensional layer, but is not limited thereto. For example, the blocking layer X may be formed of a material having a lower work function than the first active layer AL1 and the second active layer AL2. The blocking layer X may be a conductive film formed of a conductive material, for example, a metal material.

A thickness of the blocking layer X may be appropriately set based on thicknesses of the first active layer AL1 and the second active layer AL2. For example, the thickness of the blocking layer X may be smaller than that of the first active layer AL1. For example, the thickness of the blocking layer X may be smaller than that of the second active layer AL2.

Figure 11:
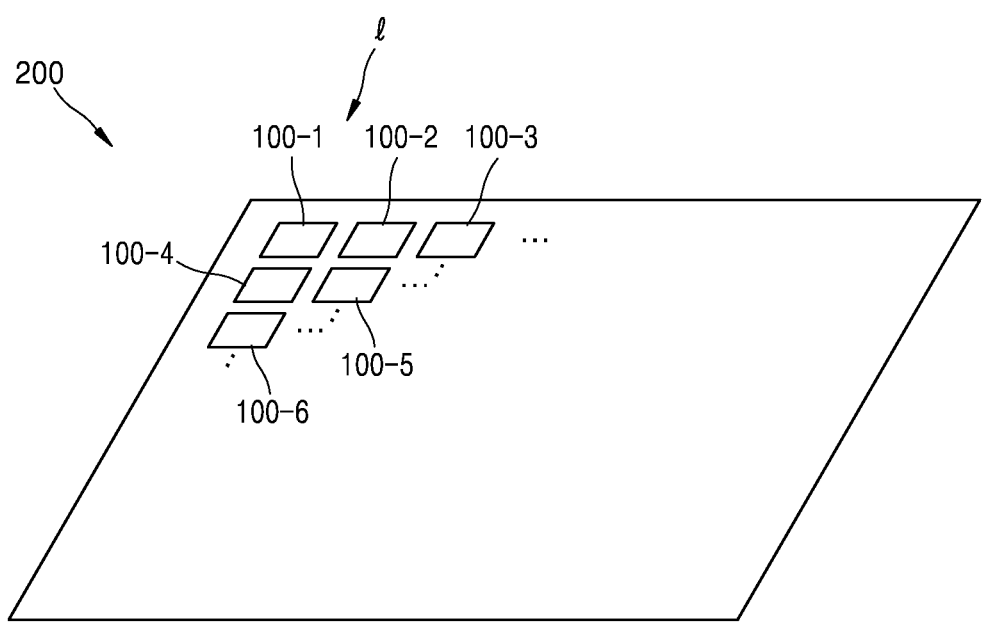
FIG. 11 is a schematic perspective view of an optical sensor according to some example embodiments.

FIG. 11 is a schematic perspective view of an optical sensor 200 according to some example embodiments. The optical sensor 200 may include a plurality of photoelectric conversion elements 100-1, 100-2, 100-3, 100-4, 100-5, and 100-6. The optical sensor 200 may include one or more of the above-described photoelectric conversion elements according to the example embodiments, as described above with reference to FIGS. 1 through 10. For example, the optical sensor 200 may include a plurality of photoelectric conversion elements receiving light in an IR region so as to be used as an IR sensor.

The optical sensor 200 according to some example embodiments may receive particularly light in an IR region, and thus may be applied to various fields that sense an IR region, compared to a silicon CMOS image sensor according to the related art. For example, the optical sensor 200 according to some example embodiments may be widely used in various application fields such as, but not limited to, biotechnology, health, face recognition, fingertip recognition, iris scanning, night vision or sensitivity adjustment.

In a photoelectric conversion element and/or an optical sensor according to some example embodiments, an effective band gap may be adjusted by using a hetero-junction structure of a two-dimensional material.

The photoelectric conversion element and the optical sensor according to some example embodiments have a high sensitivity in a broad wavelength region including an IR region.

In the photoelectric conversion element and/or the optical sensor, according to some example embodiments, an effective band gap may be adjusted by adjusting a type and thickness of a two-dimensional material, and the number of times of repeatedly stacking the material. Thus, design of the photoelectric conversion element may be easy to modify and to apply for different applications.

According to some example embodiments, the photoelectric conversion element and/or the optical sensor may be highly resistant to oxidation.

The photoelectric conversion element and the optical sensor according to the present disclosure having superior productivity.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A photoelectric conversion element comprising:
   a substrate; and
   a plurality of lattice stacks repeatedly stacked on top of each other on the substrate and configured to have an effective band gap,
   the plurality of lattice stacks each including a first active layer and a second active layer on the first active layer,
   the first active layer including a first two-dimensional material having a first band gap, and
   the second active layer including a second two-dimensional material having a second band gap not overlapping the first band gap, wherein
   a thickness of the first active layer is different from a thickness of the second active layer, and
   the thickness of the first active layer and the thickness of the second active layer are each in a range from about 1.0 nm to about 3.5 nm.

2. The photoelectric conversion element of claim 1, wherein the plurality of lattice stacks form a multi-quantum well (MQW) structure.

3. The photoelectric conversion element of claim 1, wherein the effective band gap of the plurality of lattice stacks is based on a type of the first two-dimensional material and based on a type of the second two-dimensional material.

4. The photoelectric conversion element of claim 1, wherein the first two-dimensional material and the second two-dimensional material each independently include one of a Group IV transition metal dichalcogenide (TMD) material, a Group V TMD material, or a Group VI TMD material.

5. The photoelectric conversion element of claim 1, wherein the first two-dimensional material and the second two-dimensional material each independently include one of $MoS_2$, $MoSC_2$, $MoTe_2$, $WS_2$, $WSe_2$, $WTe_2$, $ZrS_2$, $ZrSe_2$, $HfS_2$, $HfSe_2$, $SnS_2$, $SnSe_2$, $VSe_2$, $VTe_2$, $VS_2$, $VSe_2$, $VTe_2$, $NBS_2$, $NBSe_2$, $NBTe_2$, $TaS_2$, $TaSe_2$, $TaTe_2$, $TiS_2$, $TiSe_2$, $HiTe_2$, $HfTe_2$, $MoTe_2$, or $WTe_2$.

6. The photoelectric conversion element of claim 1, wherein each of the first two-dimensional material and the second two-dimensional material independently include one of perovskite, metal halide, graphitic carbon, or graphene.

7. The photoelectric conversion element of claim 1, wherein the effective band gap of the plurality of lattice stacks is based on a number of repeating lattice stacks in the plurality of lattice stacks.

8. The photoelectric conversion element of claim 1, wherein a number of the plurality of lattice stacks repeatedly stacked on top of each other is in a range of 3 to 100.

9. The photoelectric conversion element of claim 1, wherein at least one of the plurality of lattice stacks further includes a blocking layer between the first active layer and the second active layer.

10. The photoelectric conversion element of claim 1, wherein the effective band gap of the plurality of lattice stacks corresponds to an infrared region.

11. The photoelectric conversion element of claim 1, further comprising:
    a buffer layer between the substrate and the plurality of lattice stacks.

12. The photoelectric conversion element of claim 1, further comprising:
    a passivation layer on the plurality of lattice stacks.

13. An optical sensor comprising:
    at least one photoelectric conversion element of claim 1.

14. The photoelectric conversion element of claim 1, wherein the effective band gap of the plurality of lattice stacks is based on a thickness of the first active layer.

15. The photoelectric conversion element of claim 14, wherein the effective band gap of the plurality of lattice stacks is based on a thickness of the second active layer.

* * * * *